(12) United States Patent
deVilliers

(10) Patent No.: US 9,340,411 B2
(45) Date of Patent: May 17, 2016

(54) DEFECT-LESS DIRECTED SELF-ASSEMBLY

(71) Applicant: Tokyo Electron Limited, Minato-ku, Tokyo (JP)

(72) Inventor: Anton J. deVilliers, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/603,927

(22) Filed: Jan. 23, 2015

(65) Prior Publication Data

US 2015/0210812 A1    Jul. 30, 2015

Related U.S. Application Data

(60) Provisional application No. 61/932,009, filed on Jan. 27, 2014.

(51) Int. Cl.
*C08J 5/18* (2006.01)
*B81C 1/00* (2006.01)
*H01L 21/311* (2006.01)

(52) U.S. Cl.
CPC ............ *B81C 1/00* (2013.01); *H01L 21/31144* (2013.01)

(58) Field of Classification Search
CPC ...................................... C08J 7/12; C08J 5/18
See application file for complete search history.

(56) References Cited

U.S. PATENT DOCUMENTS

| | | | |
|---|---|---|---|
| 8,372,295 B2 | 2/2013 | Millward | |
| 8,574,795 B2 | 11/2013 | Hotzel | |
| 2007/0224823 A1* | 9/2007 | Sandhu | H01L 21/0332 438/694 |
| 2008/0135781 A1 | 6/2008 | Miyata et al. | |
| 2008/0217292 A1 | 9/2008 | Millward et al. | |
| 2012/0312501 A1 | 12/2012 | Koole et al. | |
| 2013/0078576 A1 | 3/2013 | Wu et al. | |
| 2014/0273476 A1* | 9/2014 | Cheng | B81C 1/00031 438/703 |

FOREIGN PATENT DOCUMENTS

JP    3940546    7/2007

OTHER PUBLICATIONS

International Patent Application No. PCT/US2015/012705, "International Search Report and Written Opinion," mailed Apr. 29, 2015, International Filing Date Jan. 23, 2015.

\* cited by examiner

*Primary Examiner* — Duy Deo
*Assistant Examiner* — Mahmoud Dahimene
(74) *Attorney, Agent, or Firm* — Wood, Herron & Evans, LLP

(57) ABSTRACT

Techniques herein enable executing directed self-assembly of block copolymer patterning processes that result in patterns having no defects or a negligibly low occurrence of defects to have a high yield of functional patterns and devices. Methods include executing a same DSA patterning sequence two or more times such that any defects in from a phase-separated first block copolymer film are corrected with a phase-separated second block copolymer film as any defect in the second block copolymer film would only temporarily cover a feature already created and/or transferred from first block copolymer film.

20 Claims, 6 Drawing Sheets

DEFECT-LESS DIRECTED SELF-ASSEMBLY

CROSS REFERENCE TO RELATED APPLICATIONS

The present application claims the benefit of U.S. Provisional Patent Application No. 61/932,009, filed on Jan. 27, 2014, entitled "Defect-less Direct Self-Assembly," which is incorporated herein by reference in its entirety.

BACKGROUND OF THE INVENTION

Techniques herein relate to methods of micro patterning including methods for patterning substrates for semiconductor microfabrication.

Fabricating semiconductors includes patterning a substrate (wafer) surface to be able to create various trenches, holes, and openings in underlying layers. Currently there are challenges with using lithographic tools to create patterns having critical dimensions that meet design specifications or desired dimensions. For example, due to the resolution limitations of patterning photoresists, patterns developed from photoresists do not have lines, trenches, and holes that are sufficiently small to meet design specifications. One technique to shrink patterns to desired dimensions is known as directed self-assembly (DSA).

Directed Self-Assembly (DSA) is a block copolymer process that uses a manufactured polymer that consists of two blocks that are connected. With proper activation, the two (or more) block copolymers will micro phase separate into individual blocks. Conceptually this is similar to how oil can be attached to water via soap. Typically oil and water do not mix but can be held together with certain chemicals, but with these binding chemicals removed, oil and water will separate. Likewise, two different blocks in a block copolymer mixture will repel each other, while other blocks can be attracted to themselves. Activation of phase separation is typically executed via addition of heat energy which causes block copolymer separation on nanoscale dimensions based on various polymer parameters. This phase separation causes nanometer-sized structures to be formed. Typically this is an alternating or repeating pattern of structures being formed. For example, alternating lines of block copolymer can be formed or assembled. Also, one block copolymer can form cylinders while the second block copolymer forms around the cylinders. Using DSA, cylinder structures can be created based on Kai the Flory interaction parameter and N—the statistical molecular weight and the volume. When DSA is coupled with a photoresist pattern (or other pattern) sub-resolution structures can be formed. This is possible because multiple lines or cylinders can be formed within feature dimensions defined by a given photoresist pattern. Accordingly, patterned dimensions provided by a photoresist pattern can be shrunk to various design specifications using directed self-assembly of block copolymers.

SUMMARY

Although directed self-assembly of block copolymers can shrink various line dimensions, there are challenges with successful execution of DSA techniques. One challenge with implementing DSA is managing defects. There is an inherent error with DSA in that roughly one out of every 25 million holes is missing or otherwise not properly formed. There are two processes for placing a DSA pattern onto a substrate. The first process is known as chemo-epitaxy. Chemo-epitaxy involves placing a chemical pattern on a substrate so that when a given block copolymer film phase separates, resulting structures will align with (or according to) that chemical pattern. The second process is known as grapho-epitaxy. Grapho-epitaxy involves creating patterned caverns, holes, and lines that provide physical structure that assist with self-assembly of block copolymers within those patterned holes caverns and lines. The grapho-epitaxial or chemo-epitaxial pattern then directs or guides assembly of block copolymers when activated. A given block copolymer film can be placed inside the smallest lines that conventional lithographic patterning can create, and then create its own smaller lines.

Techniques herein include methods to address unacceptable defectivity of conventional directed self-assembly patterning processes. The probability of a DSA process failing to create a perfect cylinder can be reduced from about one in 25 million to about one in $6.25 \times 10^{14}$. Techniques herein include executing a first DSA process (which may include one or more defects) to create a mask pattern for etching features in underlying layers, and then creating a second mask pattern using a DSA process (which may include one or more defects) to etch the same features into the underlying as from the first DSA process. The two dimensional location (spatial location) of any given defect in a first DSA film is a random two-dimensional location. Likewise, the two-dimensional location of any given defect in a second DSA film is also randomly located. The probability of any given defect from a first DSA film vertically aligning (having a same 2-D location on a substrate) with a given defect from the second DSA film is a product of each individual probability. Thus, by executing two separate but same DSA patterning steps for a same pattern, the probability of a defect preventing etching of features in underlying layers is negligibly small and can be approximated as a defect-less directed self-assembly operation.

One embodiment includes a method for patterning a substrate following several process steps. A substrate is received having multiple layers. The layers include a hardmask layer (or target layer) and one or more layers underlying the hardmask layer. A first self-assembling composition layer of block copolymers is deposited on the hardmask layer. Phase separation of the first self-assembling composition layer is activated such that a first plurality of discrete structures is formed comprising first structures of a first copolymer composition and second structures of a second copolymer composition. First structures are removed from the first self-assembling composition layer such that second structures define a first relief pattern. A first etching process can then be executed that transfers the first relief pattern into the hardmask layer. A second self-assembling composition layer of block copolymers is deposited on the substrate. Phase separation of the second self-assembling composition layer is activated such that a second plurality of discrete structures is formed comprising third structures of the first copolymer composition and fourth structures of the second copolymer composition. The second plurality of discrete structures has a same arrangement (pattern) as the first plurality of discrete structures. Third structures are removed from the second self-assembling composition layer such that fourth structures define a second relief pattern. A second etching process is executed that transfers the second relief pattern into the hardmask layer.

Methods herein, for example, remove inherent errors associated with DSA patterning that prevent DSA from being used to create memory arrays and contacts. One advantage of techniques herein is that no scanner exposure is required to use this method to create memory arrays or contacts. This means that more processing can be executed on coater/developer systems and etching tools as compared lithographic scanners, which can make semiconductor fabrication more economical.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

DETAILED DESCRIPTION

Figure 1:
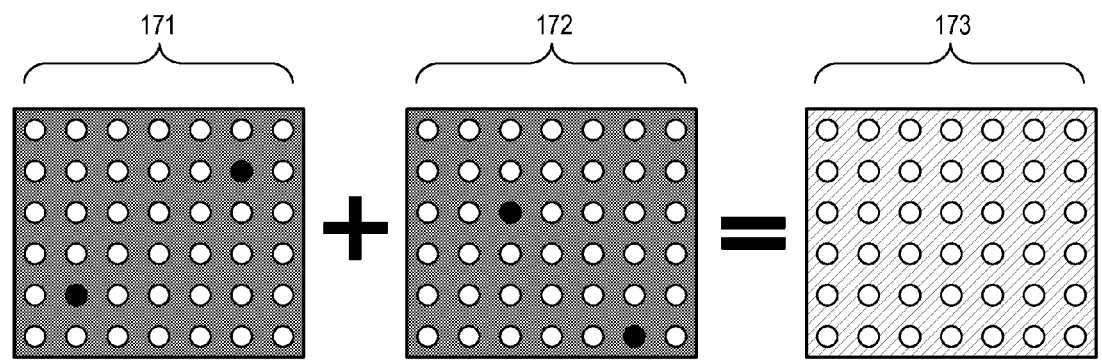
FIG. 1 is a conceptual illustration of patterning techniques as described herein.

Techniques herein enable executing directed self-assembly patterning processes that result in patterns having no defects or having a sufficiently low occurrence of defects to have a high yield of functional patterns and devices. Methods include executing a same DSA patterning sequence two or more times such that any defects in particular block copolymer film are compensated for by either a subsequent or previous block copolymer film relief pattern.

In general, in one example operation, a substrate includes a hardmask or other target layer for patterning. A chemo-epitaxial chemical film is added to the hardmask. A block copolymer film is deposited and activated to form separate block structures. One of the block copolymer structures is then removed yielding a first relief pattern. An etch operation can be used to etch into the hardmask and, optionally, past the hardmask into one or more underlying layers. At this point DSA patterning materials can be removed from the substrate down to the remaining hardmask. The chemo-epitaxial chemical film can then be reapplied and a second layer of block copolymer is applied to the wafer. This second layer of block copolymers is then activated for phase separation to form structures. One of the block copolymers is then removed such as by etching or solvent wash to yield a second relief pattern. An etch operation can use the second relief pattern as an etch mask. This etching can continue past the hardmask once again including any over-etch to make sure features have been fully etched from each relief pattern. After this DSA patterning step has been repeated, errors from the first pattern transfer and errors from the second pattern transfer application have been removed. In a typical application, repeating the DSA patterning step will yield features without defects or features having an acceptable level of defectivity such as one defect per N fields or N wafers. Note that this DSA correction technique can be implemented by applying not just with two DSA layers, but can be repeated multiple times to further reduce the probability of any errors.

There are several different types of directed self-assembly processes, or rather, there are different types of applications of DSA. For example, DSA can be used for patterning trenches and lines for wiring applications, for patterning gates and fins of transistors, etc. For convenience in describing embodiments herein, this disclosure will primarily focus on applications for creating memory arrays and contacts such as for logic contacts—though embodiments are not limited to such applications and those skilled in the art will recognize a wide variety of other applications. Note that for logic applications the contacts can be arranged in any particular pattern design.

Methods herein, for example, remove inherent errors associated with DSA patterning that prevent DSA from being used to create memory arrays and contacts. One advantage of techniques herein is that no scanner exposure is required to use this method to create memory arrays or contacts. This means that more processing can be executed on coater/developer systems and etching tools as compared lithographic scanners, which can make semiconductor fabrication more economical.

FIG. 1 is a conceptual illustration of defect mitigation techniques for use with directed self-assembly of block copolymers. FIG. 1 illustrates the principle of error reduction as described herein. Contact array 171 shows the results of a given DSA contact patterning operation and hardmask etch. The probability of having any given error is about one in 25 million. Example defects are shown in this contact array as black circles. White circles represent contact holes that have been etch through a hardmask, with the hardmask shown in gray. Note that in this example there are two defects randomly located within the contact array 171. Contact array 172 shows the results of a second DSA contact patterning operation and hardmask etch using an identical pattern or pre-pattern. Note that this second patterning operation yields two defects which are randomly distributed as well in contact array 172. Comparing a contact array 171 to contact array 172, it should be apparent that defects from contact array 171—if overlaid on contact array 172—would not overlap vertically with defects on contact array 172. This means that each given contact opening has a successful punch etch or through etch in at least one of the DSA patterning operations. The defects that occur are in one of the polymers layers and thus would be removed with removal of all the polymer materials. When adding the first DSA operation to the second DSA operation a resulting contact array has no errors as represented by contact array 173. This resulting pattern (contact array 173) essentially provides a zero defect probability $(25 \times 10^6 * 25 \times 10^6) = 6.25 \times 10^{14}$. In other words, instead of having a patterning defect on almost every microchip being produced, DSA patterning based defects with techniques herein would affect one microchip in about 10,000 processed wafers.

Figure 2:
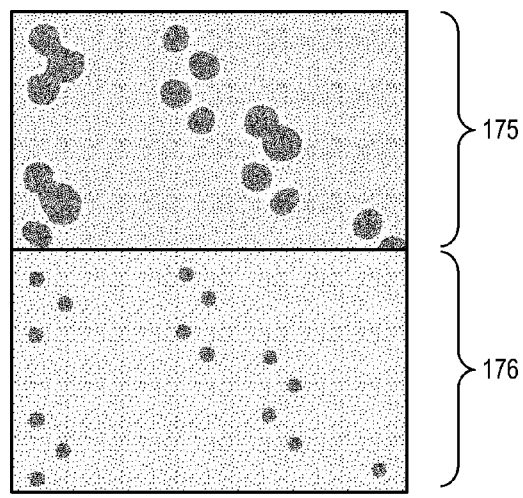
FIG. 2 is an example illustration of logic contact rectification.

One example application is for logic contact applications, a given shape of the logic contact itself can be a square, rectangular, L-bend, T-shaped, or any other configuration. In practice, however, in certain embodiments, actual contacts formed within the design shape may comprise a set of cylinders. For example, a square contact shape pre-pattern may resolve (phase separate) into an array of four cylinders in a 2×2 arrangement. In another example, rectangular contacts can be embodied as a series of four cylinders. In other words, a pre-pattern may not have a same shape as a post pattern. Logic contact applications can include logic contact rectification. FIG. 2 is an example illustration of logic contact rectification. Pre-pattern 175 is shown above post pattern 176. Note that in pre-pattern 175 the openings are not all uniform, but in post pattern 176 after DSA patterning execution, the contacts are resolved to sub-resolution contacts, which are accurately defined. This logic contact rectification is already in use, and so embodiments herein enable this contact creation without errors. Currently there is a challenge with defectivity. One in about every 25,000,000 contacts fails to rectify properly because of random variations within the block copolymers. This is failure rate is typically unacceptable for semiconductor device fabrication.

Figure 3:
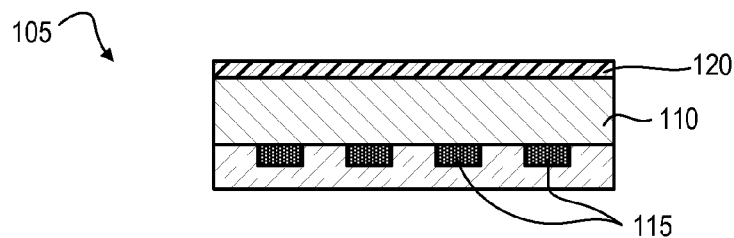
FIGS. 3-14 are cross-sectional schematic views of an example substrate segment showing a process flow according to embodiments disclosed herein.

FIGS. 3-14 and 15-21 are schematic cross-sections of an example substrate detailing process sequences that correct defects in a given DSA patterning operation. Thus, one embodiment includes a method for patterning a substrate. Referring now to FIG. 3, process flow can begin with a substrate 105 being received (or provided) at a processing tool or system. Substrate 105 can have one or more layers. Substrate 105 includes target landing structures 115 that can be positioned within a substrate layer. Substrate 105 includes multiple target landing structures 115, which can be contacts for transistors, memory arrays, etc. This particular example includes hardmask layer 120 positioned on one or more layers underlying the hardmask layer 120 such as insulation layer 110. Note that hardmask layer 120 and/or insulation layer 110 can be considered as a target layer, that is, a layer designed to be patterned as a mask, as permanent structures, as mandrels, or otherwise.

Figure 4:
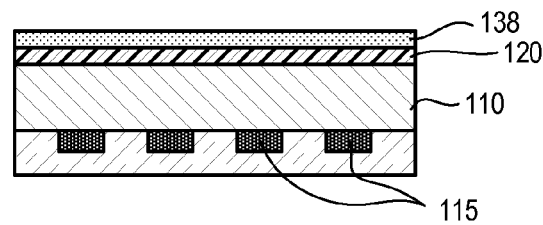

Next, a pattern template 138 can be applied to hardmask layer 120 as shown in FIG. 4. The pattern template 138 can be a film or pattern that enables or directs self-assembly of block copolymers. In some embodiments pattern template 138 can include a chemo-epitaxy chemical film applied on the hardmask layer. This chemo-epitaxy film assists with self-assembly of block copolymers. In other words, this chemo-epitaxy film helps direct formation of nanostructures when phase separation is activated. The chemo-epitaxy film can alternatively be a grapho-epitaxy film, or a combination of both.

Figure 5:
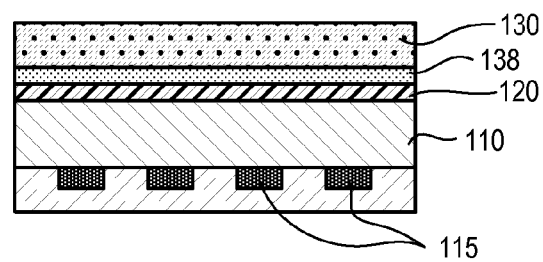

A first composition layer 130 is deposited on the substrate 105, which can be a layer of block copolymers configured for self-assembly. Such copolymer compositions are known and conventionally available. Deposition is typically executed via a liquid spin-on process, though other mechanisms can be used for deposition. FIG. 5 shows first composition layer as a mixture of dots and dashed lines.

Figure 6:
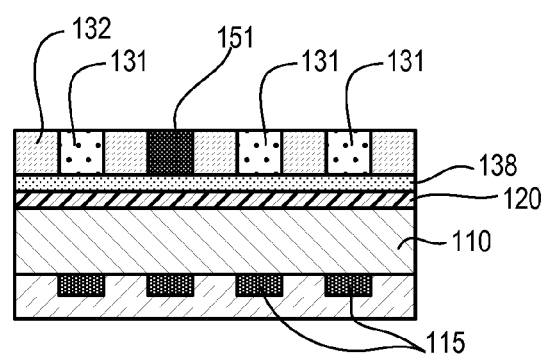

After deposition of the first composition layer 130, the block copolymers are activated to initiate phase separation such that a first plurality of discrete structures is formed comprising first structures of a first copolymer composition and second structures of a second copolymer composition. Activation is typically executed by application of heat, radiation, or other energy source. FIG. 6 illustrates an example result after block copolymers are separated into a repeating pattern of nanostructures. Depending on a particular pre-pattern, block copolymers can phase separate into a pattern of repeating lines, cylinders, or other structures. In this example, structures 131 can include vertical cylinders that have formed within structure 132, which can be a layer that forms around cylinders or defines cylindrical spaces that contain a counterpart block copolymer. Note that in the second cylindrical location from the left in FIG. 6, a defect 151 has occurred. Defect 151 can be a partially phase-separated structure, or cylinders that have failed to form at all so that the defect is not a different material, but simply a continuation of a particular material that form around cylinders.

Figure 7:
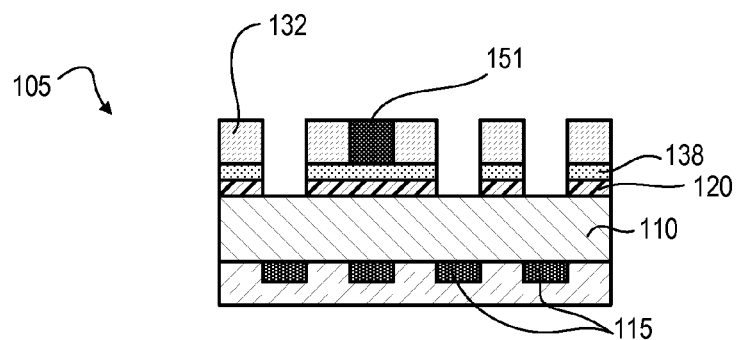
Figure 8:
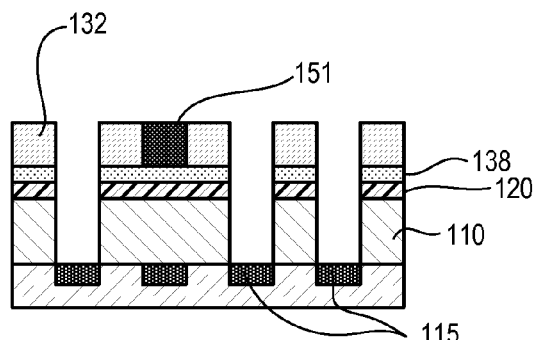

After phase separation there are nanostructures of different material compositions which enable selective removal and/or etching of one of the block copolymers. FIG. 7 shows an example result after structures 131 have been removed by ashing, etching, dissolving, or otherwise. Note that corresponding locations in the hardmask layer 120 have been opened. In other words, after removing one of the assembled block copolymers, the remaining block copolymer functions as a mask for a subsequent etching operation. That is, removing first structures from the first composition layer results in second structure(s) defining a first relief pattern. An exception to this pattern transfer is where defect 151 is located. Because there was no structure removed at this location, there was no space opened for etching underlying layers. FIG. 7 shows a result of etching at least hardmask layer 120, that is, transferring the first relief pattern into the hardmask layer 120. FIG. 8 shows a result of additionally etching insulation layer 110, which uncovers target landing structures 115. Thus, executing the first etching process that transfers the first relief pattern into the hardmask layer 120 can include transferring the first relief pattern into one or more underlying layers. In this example, three of four target landing structures 115 have been uncovered. Any number of underlying layers can be etched using structure 132 as a mask. Various etch and reactive chemistries can be used depending on the composition of underlying layers.

Figure 9:
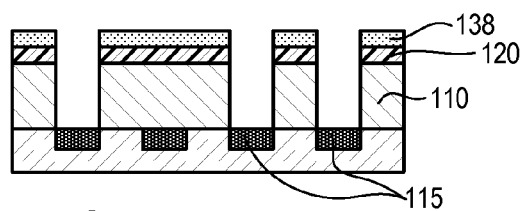
Figure 10:
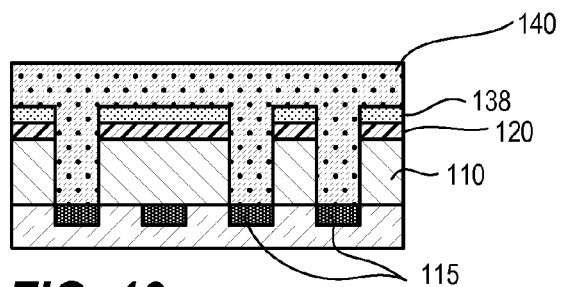

With a first etch process completed, remaining block copolymer material, including structure 132, can be removed from substrate 105 as shown in FIG. 9. If needed, a chemo-epitaxy film or other pattern template can be reapplied to assist with subsequent self-assembly, such as by using an identical pattern for directed self-assembly. Optionally, a planarizing fill can be deposited prior to reapplying the pattern template. A second composition layer of block copolymers is deposited on the substrate, as shown in FIG. 10.

Figure 11:
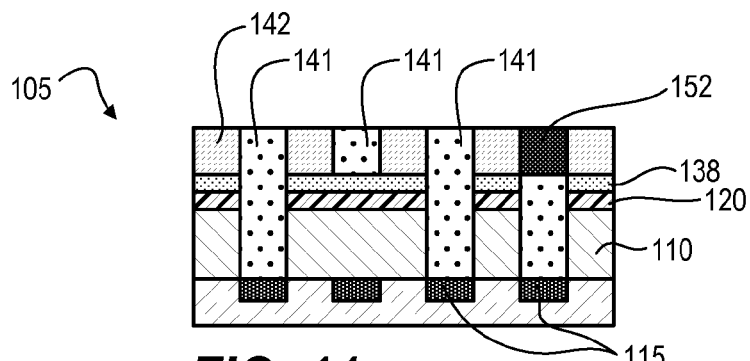

The second composition layer can then be activated to cause phase separation such that a second plurality of discrete structures is formed comprising third structures of the first copolymer composition and fourth structures of the second copolymer composition. The second plurality of discrete structures have a same arrangement as the first plurality of discrete structures. An example result of this directed self-assembly of block copolymers is shown in FIG. 11. Note that three structures 141 have again successfully formed with one cylinder or structure being a defect 152. Also note, however, that the defect is located over a different target landing structure as compared to defect 151 from FIG. 6.

Third structures, such as structures 141, are then removed from the second composition layer such that fourth structures, such as structure 142, define a second relief pattern. Structures 142 define a same pattern as structures 132. For example, polymer material forming cylindrical nanostructures, such as structures 141, is removed to uncover the hardmask layer 120 underneath. Defect 152 appears at a different location (different planar or X-coordinate Y-coordinate location) as compared to the first defect 151 from the first composition layer. Thus while there can be one or more defects occurring in the first structures that prevent complete transfer of the first relief pattern, and there can be one or more defects occurring in the third structures that prevent complete transfer of the second relief pattern, defects occurring in the first structures are located at different planar locations than defects occurring in the third structures. Thus, any given defect from the first composition layer is corrected with the second composition layer, and any defect in the second composition layer would only temporarily cover a feature already created/completed from the first composition layer.

Figure 12:
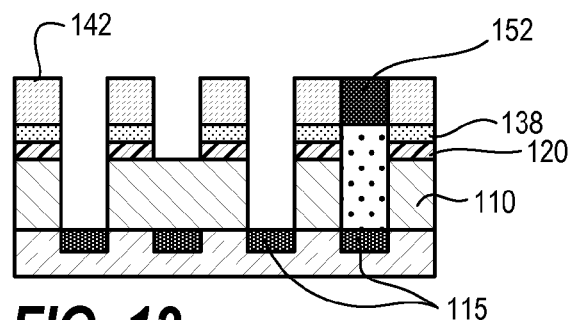
Figure 13:
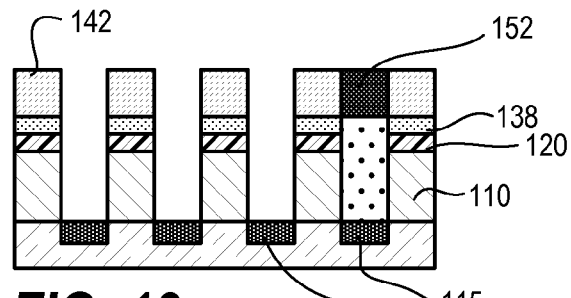

A second etching process can be executed that transfers the second relief pattern into the hardmask layer 120, as shown in FIG. 12. As with the first etching process, the hardmask layer 120 is opened up which opens the hardmask in the second column location, which was previously covered because of defect 151. A same or subsequent etch operation can be continued to etch down to underlying target landing structures 115. This can include an over-etch application. For the first etching process there was a 100% etch down to the target landing structure. The second etching process also needs to be 100% etched down to the target landing structures. For the second column this will be the first time that the insulation layer 110 has been removed down to the target landing structure. For other columns this will involve an over etch process but, by using a high etch selectivity chemistry, the underlying target landing structures will not be significantly damaged. An example result is shown in FIG. 13.

Figure 14:
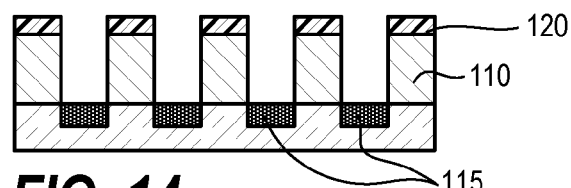

After the second etch operation all polymer material can again be removed which will remove the defect from the second composition layer. An example result is shown in FIG. 14. Note that the target landing structure or contact below the defect in the second composition layer has already been etched and thus removing polymer material from the second composition layer yields a pattern structure having contact openings defined without any defects.

Figure 15:
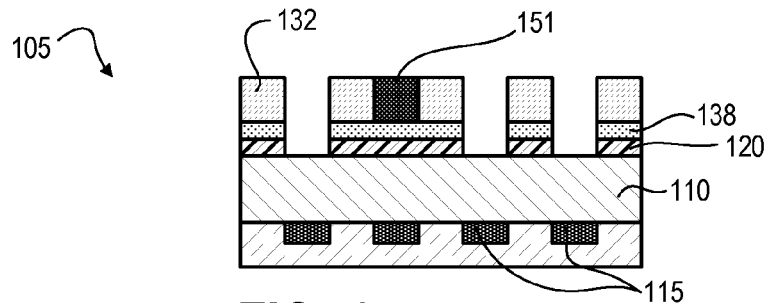
FIGS. 15-21 are cross-sectional schematic views of an example substrate segment showing a process flow according to embodiments disclosed herein.
Figure 16:
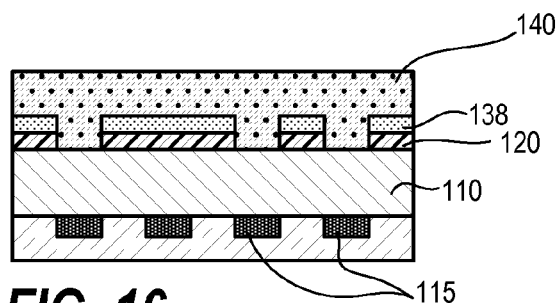

FIGS. 15-21 illustrate an alternative sequence for correcting errors from patterning using multiple applications of block copolymers and directed self-assembly. As described above, a given substrate 105 can begin with a chemo-epitaxy chemical film applied over a hardmask and underlying layers, and then a first block copolymer film or first composition layer is deposited on the substrate. The first composition layer is activated to cause phase separation into nanostructures. FIG. 15 shows structures 132 formed by one of the polymers materials. At one location, however, one structure failed to properly form and has a defect 151 that prevents successful etch operations through this defect 151. Note that FIG. 15 is comparable to FIG. 7. Either in a single step, or with multiple steps, the polymer cylinders can be removed and the underlying hardmask layer 120 is opened up (etched) at these locations without substantially etching any underlying layers such as the insulation layer 110.

At this point, as an alternative to the previous flow, etching does not need to be continued into the insulation layer 110 or any other underlying layer. In other words, is only the hardmask layer 120 that is opened up. The hardmask layer can be relatively thin as compared to other layers, and this relative thinness can assist with a second DSA application. A second composition layer 140 of block copolymers is deposited, with an example result shown in FIG. 16. Any DSA patterning preparation steps used for the first composition layer can be repeated here if needed. The etched hardmask layer can function as a grapho epitaxy template.

Figure 17:
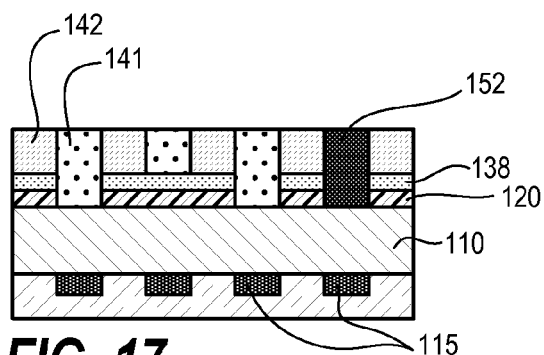

The second composition layer is then activated to cause phase separation. As with the first composition layer, nanostructures have formed as shown in FIG. 17. Note that there is one defect 152 in the formation of structures, but this defect is located at a different location as compared to defect 151 resulting from the first composition layer.

Figure 18:
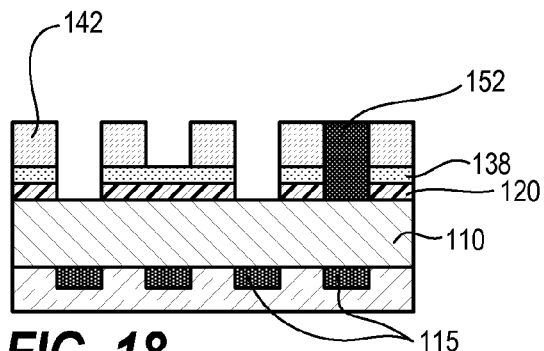
Figure 19:
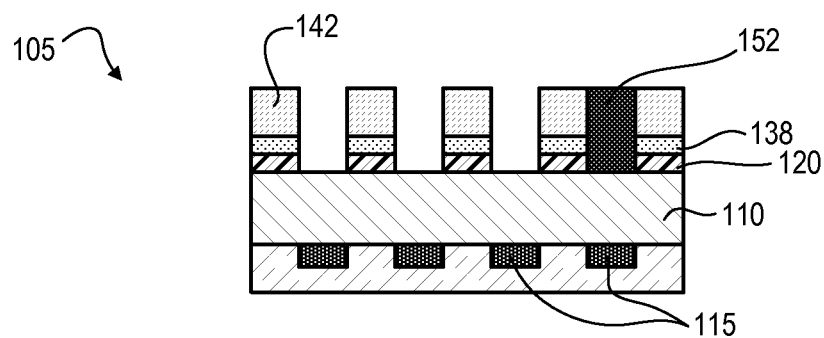

Structures 141 formed from one polymer material are then removed to uncover any hardmask layer locations that have not been opened up (etched through) as a result of a previous defect such as defect 151. FIG. 18 shows an example result after removing one polymer material. With no defect over the second column, in this example, an etch operation can punch through the hardmask at this two-dimensional location. FIG. 19 shows a result of such pattern transfer.

Figure 20:
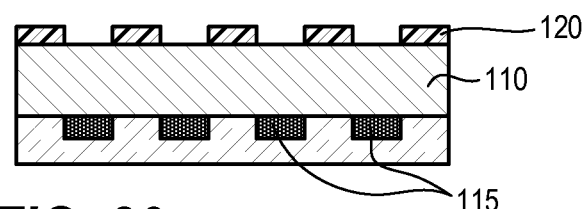
Figure 21:
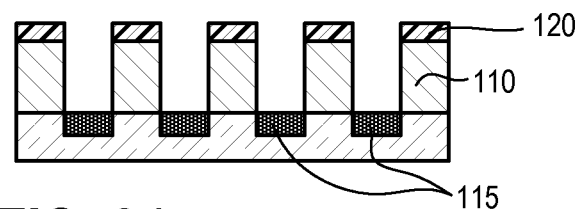

All polymer materials and DSA-assisting films can then be removed such as via a wet clean and/or wet etch. The result is a patterned hardmask layer having a pattern defined by DSA-formed nanostructures as shown in FIG. 20. With a patterned hardmask layer 120—having defects corrected—the pattern can be transferred through any underlying layers such as the insulation layer 110. FIG. 21 shows an example result. One advantage of this process flow is that the insulation layer is etched only once, which avoids a 200% etch that would be applied at most contact locations.

Another embodiment includes a method of patterning a substrate, the method comprises receiving a substrate that includes a target layer positioned on an underlying layer. A first composition layer is deposited on the target layer, with the first composition layer including block copolymers. Phase separation of the first composition layer is activated such that a first structural pattern is formed of a first copolymer and a second structural pattern is formed of a second copolymer. A second composition layer is deposited on the substrate. The second composition layer includes block copolymers. Phase separation of the second composition layer is activated such that a third structural pattern is formed of a third copolymer and a fourth structural pattern is formed of a fourth copolymer. The third structural pattern has a same layout as the first structural pattern. The first copolymer and the third copolymer can be comprised of a same material.

This patterning method can also include removing the first structural pattern from the first composition layer such that the second structural pattern remains and defines a first relief pattern, as well as removing the third structural pattern from the second composition layer such that the fourth structural pattern defines a second relief pattern. The first structural pattern can be removed prior to depositing the second composition layer. The third structural pattern can be removed prior to removing the first structural pattern. A first etching process can be executed that transfers the first relief pattern into the target layer, and a second etching process can be executed that transfers the second relief pattern into the target layer. Executing the first etching process that transfers the first relief pattern into the target layer can include transferring the first relief pattern into the underlying layer.

One or more defects can occur in the first structures that prevent complete transfer of the first relief pattern, and also one or more defects can occur in the third structures that prevent complete transfer of the second relief pattern. In most cases, defects occurring in the first structures are located at different planar locations than defects occurring in the third structures.

The target layer can include a pattern template that directs self-assembly of block copolymers, and this pattern template can include a chemo-epitaxy film or grapho-epitaxy structures. Methods can include reapplying the pattern template after executing the first etching process and prior to depositing the second composition layer. In some embodiments, a planarizing fill material can be deposited prior to reapplying the pattern template.

Note that the techniques herein can also compensate for critical dimensions that are too small to form contacts because the template critical dimension was too small. During the first etch step, which can be a punch etch, CDs may grow a little bit by virtue of the etch chemistry and etch process that includes some isotropic etching along with the anisotropic etching. Thus, if a random variance is due to a CD being slightly too small, the redundant DSA process can inherently correct this. The initial CD will be widened during the first etch step so that in the second DSA step the CD will no longer create a defect. In other words, CDs can be shifted between the first and second etch to compensate for any particular CDs that may have been initially too small for proper contacts.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method for patterning a substrate, the method comprising:
   receiving a substrate having multiple layers, the layers including a hardmask layer and one or more layers underlying the hardmask layer;
   depositing a first composition layer of block copolymers on the hardmask layer;
   activating phase separation of the first composition layer such that a first plurality of discrete structures is formed comprising first structures of a first copolymer composition and second structures of a second copolymer composition;
   removing the first structures from the first composition layer such that the second structures define a first relief pattern;
   executing a first etching process that transfers the first relief pattern into the hardmask layer;
   removing the second structures from the first composition layer;
   depositing a second composition layer of block copolymers on the substrate;
   activating phase separation of the second composition layer such that a second plurality of discrete structures is formed comprising third structures of the first copolymer composition and fourth structures of the second copolymer composition, the second plurality of discrete structures having a same two-dimensional location and arrangement as the first plurality of discrete structures;
   removing the third structures from the second composition layer such that the fourth structures define a second relief pattern; and
   executing a second etching process that transfers the second relief pattern into the hardmask layer.

2. The method of claim 1, wherein the hardmask layer includes a pattern template that directs self-assembly of block copolymers.

3. The method of claim 2, wherein the hardmask layer includes a chemo-epitaxy film.

4. The method of claim 2, wherein the hardmask layer includes grapho-epitaxy structures.

5. The method of claim 2, further comprising reapplying the pattern template after executing the first etching process and prior to depositing the second composition layer.

6. The method of claim 5, further comprising depositing a planarizing fill material prior to reapplying the pattern template.

7. The method of claim 1, wherein executing the first etching process that transfers the first relief pattern into the hardmask layer includes transferring the first relief pattern into the one or more underlying layers.

8. The method of claim 1, wherein the first structures and the third structures define a same pattern of structures.

9. The method of claim 2, wherein one or more defects occur in the first structures that prevent complete transfer of the first relief pattern; and
   wherein one or more defects occur in the third structures that prevent complete transfer of the second relief pattern, wherein the defects occurring in the first structures are located at different two-dimensional locations than the defects occurring in the third structures.

10. A method of patterning a substrate, the method comprising:
    receiving a substrate that includes a target layer positioned on an underlying layer;
    depositing a first composition layer on the target layer, the first composition layer including block copolymers;
    activating phase separation of the first composition layer such that a first structural pattern is formed of a first copolymer and a second structural pattern is formed of a second copolymer;
    removing the first structural pattern from the first composition layer such that the second structural pattern remains and defines a first relief pattern;
    executing a first etching process that transfers the first relief pattern into the target layer;

removing the second structural pattern from the first composition layer;

depositing a second composition layer on the substrate, the second composition layer including block copolymers; and activating phase separation of the second composition layer such that a third structural pattern is formed of a third copolymer and a fourth structural pattern is formed of a fourth copolymer, the third structural pattern having a same two-dimensional location and arrangement as the first structural pattern.

11. The method of claim 10, further comprising:

removing the third structural pattern from the second composition layer such that the fourth structural pattern defines a second relief pattern.

12. The method of claim 10, wherein the first structural pattern is removed prior to depositing the second composition layer.

13. The method of claim 11, wherein the third structural pattern is removed prior to removing the first structural pattern.

14. The method of claim 11, further comprising:

executing a second etching process that transfers the second relief pattern into the target layer.

15. The method of claim 14, wherein one or more defects occur in the first structural pattern that prevent complete transfer of the first relief pattern; and wherein one or more defects occur in the third structural pattern that prevent complete transfer of the second relief pattern, wherein the defects occurring in the first structural pattern are located at different two-dimensional locations than the defects occurring in the third structural pattern.

16. The method of claim 10, wherein executing the first etching process that transfers the first relief pattern into the target layer includes transferring the first relief pattern into the underlying layer.

17. The method of claim 10, wherein the first copolymer and the third copolymer are comprised of a same material.

18. The method of claim 10, wherein the target layer includes a pattern template that directs self-assembly of block copolymers, wherein the pattern template includes a chemo-epitaxy film or grapho-epitaxy structures.

19. The method of claim 18, further comprising reapplying the pattern template after executing the first etching process and prior to depositing the second composition layer.

20. The method of claim 19, further comprising depositing a planarizing fill material prior to reapplying the pattern template.

* * * * *